United States Patent [19]
Takeda et al.

[11] Patent Number: 4,887,186
[45] Date of Patent: Dec. 12, 1989

[54] MULTI-LAYERED DIELECTRIC ELEMENT

[75] Inventors: Takeshi Takeda, Kawasaki; Sohji Tsuchiya, Kanagawa; Yoshio Watanabe, Yokohama; Satoshi Sekido, Kawasaki, all of Japan

[73] Assignee: Matsushita Electric Industrial Co., Ltd., Osaka, Japan

[21] Appl. No.: 337,594

[22] Filed: Apr. 12, 1989

[30] Foreign Application Priority Data

Apr. 12, 1988 [JP] Japan .................................. 63-89833
Sep. 5, 1988 [JP] Japan ................................ 63-221714

[51] Int. Cl.$^4$ ........................ H01G 4/10; H01B 3/12; H01B 1/06
[52] U.S. Cl. .................................. 361/321; 252/521; 264/61
[58] Field of Search .................. 264/61; 252/518, 519, 252/521; 361/321, 320, 304, 305

[56] References Cited

U.S. PATENT DOCUMENTS

| | | | |
|---|---|---|---|
| 3,996,168 | 12/1976 | Hoffmann et al. | 252/521 X |
| 4,075,681 | 2/1978 | Popowich | 361/305 |
| 4,296,002 | 10/1981 | Sokoly et al. | 252/518 |
| 4,305,848 | 12/1981 | Hikita et al. | 264/61 X |
| 4,362,637 | 12/1982 | Matsuo et al. | 252/521 X |
| 4,799,127 | 1/1989 | Ono et al. | 361/321 |

OTHER PUBLICATIONS

"Electrodes for Piezoelectric Actuators" by Kenji Uchino; Ceramics, vol. 21, No. 3, Mar. 1986; published by The Ceramic Society of Japan.

Primary Examiner—Donald A. Griffin
Attorney, Agent, or Firm—Lowe, Price, LeBlanc, Becker & Shur

[57] ABSTRACT

A multi-layered dielectric element serving as a capacitor or actuator which comprises a dielectric unit including a plurality of dielectric layers made of a perovskite oxide and a plurality of internal electrode layers sandwiched between the respective dielectric layers. The internal electrodes are each made of at least one conductive composite oxide of La, Ba and Cu having a perovskite-like structure wherein the atomic ratios of the metals are such that $(La+Ba)/Cu=1$ and $La/Ba=4$, or at least one conductive composite oxide of La, Sr and Cu having a perovskite-like structure wherein the atomic ratios of the metals are such that $(La+Sr)/Cu=1$ and $La/Sr=3$ or 4. The unit is sintered at a temperature of from 900° to 1100° C., so that interdiffusion of metal ions between the dielectric layers and the internal electrode layers is suppressed to a significant extent.

19 Claims, 1 Drawing Sheet

MULTI-LAYERED DIELECTRIC ELEMENT

BACKGROUND OF THE INVENTION

1. Field of the Invention

This invention relates to a multi-layered dielectric element for use as a capacitor or an actuator.

2. Description of the Prior Art

In recent years, great attention has been directed to multi-layered dielectric elements and particularly, to multi-layered ceramic capacitors and multi-layered piezoelectric actuators. These elements are fabricated by forming sheets from a slurry of dielectric powder, printing an ink for electrode on the respective sheets, superposing these sheets and sintering the superposed sheets thereby forming a multi-layered element containing electrodes in the inside thereof. The capacitor obtained in this manner has a large capacitance with a small size. When this element is used as an actuator, the generation force increases. The sintering temperature for these elements are generally in the range of from 1250° C. to 1350° C. The sintering at such a high temperature in air disenables inexpensive metals such as Cu or Ni to be used because of the oxidation thereof. Use of expensive metals such as Pd is indispensable, incurring high production costs.

In order to solve the above problem, there has been proposed use, as the internal electrodes, of conductive oxides which are stable at high temperatures. For instance, $La_2NiO_4$ having a specific resistance of $\sim 10^{-2}$ $\Omega$cm has been proposed for use in capacitors (World Congress On HighTech Ceramics, at Milan on June 24–28, 1986). In this report, $BaTiO_3$ is used as dielectric layers. $La_2NiO_4$ electrodes are sandwiched between the respective dielectric layers, followed by co-sintering at about 1300° C., wherein the interdiffusion of the metal ions at the interface between the dielectric layer and the internal electrode has been studied. When the sintering is contained at 1300° C. for 2 hours, the length of the interdiffusion is about 20 $\mu$m. If the $BaTiO_3$ layer has a thickness of 40 $\mu$m or over, this layer is rendered low in resistance owing to the interdiffusion, making it difficult to use the element as a capacitor. For making a thin ion-diffused layer, it is necessary that the sintering be effected at lower temperatures. In addition, it is assumed that since the oxide use has a specific resistance of $\sim 10^{-2}$ $\Omega$cm which is higher by three orders of magnitude than metals, high frequency characteristics become poorer. On the other hand, with a piezoelectric actuator, there has been proposed use of a semiconductor of $BaTiO_3$ to which La is added. In this actuator, $BaTiO_3$ is used as a piezoelectric or dielectric layer. The semiconductor layers and the $BaTiO_3$ layers which are alternately superposed are co-sintered at 1270° C. The resultant element has been configured as working as an actuator (Ceramics, Vol. 21, pp. 229, 1986). When the La-added $BaTiO_3$ semiconductor layers and the insulating $BaTiO_3$ layers are alternately superposed, a problem involved is the diffusion of La ions alone. In this element, the specific resistance abruptly varies in relation to the concentration of the La ions, thus making a clear interface between the layers. However, the specific resistance of the La-added semiconductor is high at $\sim 10$ $\Omega$·cm, which places a limitation on the formation of a thin internal electrode layer, i.e. the thickness of 50 $\mu$m or below is considered difficult.

For the fabrication of multi-layered dielectric elements, it is essential that a low temperature sintering technique be established in order to reduce the interdiffusion to an extent involving no practical problem and that choice of a material for the internal electrode having a low resistance be made. The sintering of $BaTiO_3$ used as a dielectric material may be effected at a reduced temperature of from 900° C. to 1100° C. when adding a sintering aid such as LiF or $BaLiF_3$. Aside from $BaTiO_3$, it is known that $Pb(Fe_{\frac{1}{2}}Nb_{\frac{1}{2}})_{0.7}(Fe_{\frac{2}{3}}W_{\frac{1}{3}})_{0.3}O_3$ having a perovskite structure can be sintered at temperatures indicated above. Accordingly, it is necessary to find out a conductive oxide having a lower specific resistance which is able to be sintered at a similar temperature.

SUMMARY OF THE INVENTION

It is an object of the present invention to provide a multi-layered dielectric element which comprises internal electrodes made of a conductive oxide which has a low specific resistance in the order of about $10^{-3}$ to $10^{-4}$ $\Omega$·cm, is inexpensive and can be sintered at a low temperature of from 900° C. to 1100° C.

It is another object of the invention to provide a multi-layered dielectric element which has an arrangement of dielectric layers and internal electrodes alternately superposed without involving any appreciable degree of interdiffusion of metal ions at the interface between each dielectric layer and each electrode.

It is a further object of the invention to provide a method for making a multi-layered dielectric element whereby strong bonding between conductive oxide electrode layers and dielectric layers is obtained with an improved yield.

The above objects can be achieved, according to one embodiment of the invention, by a multi-layered dielectric element which comprises a multi-layered unit including a plurality of dielectric layers formed of perovskite oxide capable of sintering at a temperature of from 900° to 1100° C. and a plurality of internal electrode layers which are, respectively, sandwiched between adjacent dielectric layers so that the respective internal electrode layers have exposed portions which allow contact with external electrodes. The invention is characterized in that the internal electrodes are each made of at least one conductive composite oxide of La, Ba and Cu having a perovskite-like structure wherein the atomic ratios of the metals are such that $(La+Ba)/Cu=1$ and $La/Ba=4$ or at least one conductive composite oxide of La, Sr and Cu having a perovskite-like structure wherein the atomic ratios of the metals are such that $(La+Sr)/Cu=1$ and $La/Sr=4$ or $La/Sr=3$. It has been found that when the unit is sintered at a low temperature of from 900° C. to 1100° C., strong bonding between the dielectric perovskite oxide layer and the internal electrode layer is established. Further, the interdiffusion between the conductive composite oxide and the dielectric perovskite oxide proceeds only slightly at such a low temperature, thus substantially preventing the dielectric layers from lowering the resistance. The element may further comprise a pair of electrodes which are electrically separated from each other and are alternately connected with the internal electrodes at the exposed portions.

If the dielectric layer is formed mainly of $BaTiO_3$, the internal electrode layer should preferably be made of a mixture of the conductive composite oxide and $BaTiO_3$, $SrTiO_3$ or a mixture thereof by which stronger bonding between the internal electrode layers and the dielectric layers is ensured.

DETAILED DESCRIPTION AND EMBODIMENTS OF THE INVENTION

Figure 1:
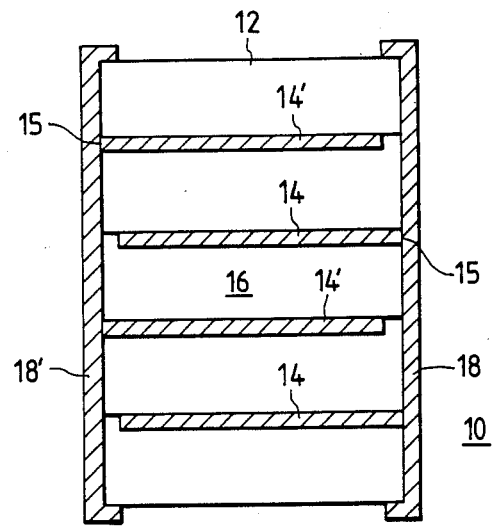
FIG. 1 is a schematic view of a multi-layered ceramic capacitor or multi-layered piezoelectric actuator according to one embodiment of the invention.
Figure 2:
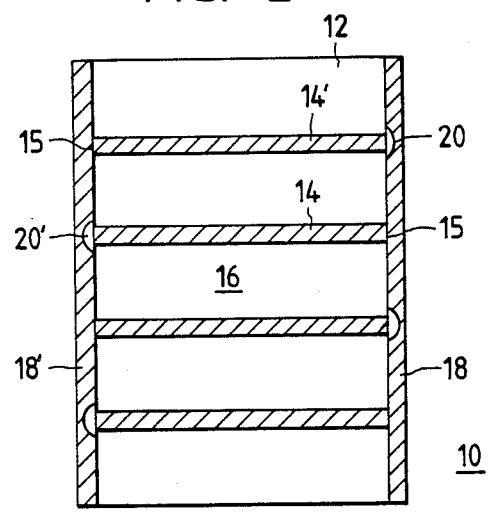
FIG. 2 is a view similar to FIG. 1 but shows another embodiment of the invention.

Referring now to the accompanying drawings wherein like reference numerals indicate like parts or members. In FIGS. 1 and 2, there is generally shown a multi-layered dielectric element 10 serving as a multi-layered ceramic capacitor or multi-layered ceramic piezoelectric actuator. The element 10 includes a plurality of dielectric layers 12 and internal electrodes 14, 14' superposed alternately thereby forming a unit 16 as shown. External electrodes 18, 18' are attached to opposite sides along the thickness of the unit 16. The external electrodes 18, 18' are connected to alternately different internal electrodes 14, 14' so that the electrode 18 is connected to every other intrnal electrode 14 on one side of the unit 16 and the electrode 18' is connected to every other internal electrode 14' on the other side of the unit 16. In FIG. 1, the internal electrodes 14, 14' are exposed alternately at opposite sides to allow the alternate connection with the respective connection electrodes 18, 18'. If, however, the internal electrodes 14, 14' are formed entirely on one side of each dielectric layer 12 as shown in FIG. 2, one external electrode 18 is connected to every other internal electrode 14 at one side of the electrode 14 and is insulated at 20 as shown in the figure. At the other side of the unit 16, the external electrode 18' is connected to alternate remaining electrodes 14 and is insulated at 20'. Thus the external electrodes 18,18' are, respectively, connected to one group of the alternate internal electrodes 14 and the other group of the alternate internal electrodes 14' at opposite sides of the unit 16 as shown in FIG. 2. It should be noted that the embodiments shown in FIGS. 1 and 2 include a pair of external electrodes attached to opposite sides of the unit 16, but other arrangements of the electrodes may be used provided that the electrodes are electrically separated and connected to the respective groups of the internal electrode layers 14, 14'.

In general, the dielectric layer 12 is formed as having a thickness of several ten micrometers to several hundred micrometers. The dielectric layer is made of any perovskite-type oxide which is capable of sintering at temperatures of from 900° to 1100° C. with or without addition of sintering aids. Specific and preferred examples of such oxides include $BaTiO_3$ to which a sintering aid such as LIF or $BaLiF_3$ is added, and $Pb(Fe_{\frac{1}{2}}Nb_{\frac{1}{2}})_{0.7}(Fe_{\frac{2}{3}}W_{\frac{1}{3}})_{0.3}$. If $BaTiO_3$ is used along with the sintering aid, the content of the sintering aid should preferably be in the range of from 0.1 to 10 wt% of the mixture.

The internal electrode layer 14, 14' should preferably have a thickness of from 5 to 50 micrometers. This layer 14 or 14' is made of a conductive composite oxide of a perovskite-like structure by which it exhibits good affinity for the dielectric layer made of the perovskite oxide. The conductive composite oxide should be sintered at temperatures of from 900° to 1100° C. in order to avoid undesirable interdiffusion between the dielectric layer and the internal electrode layer. Moreover, the conductive composite oxide should preferbly have an appropriate specific resistance of not higher than $1 \times 10^{-3}$ $\Omega$·cm. The conductive oxide of the perovskite-like structure which satisfies the requirements for the sintering conditions and the specific resistance should be at least one composite oxide of La, Ba and Cu wherein the atomic ratios of the metals are such that $(La+Ba)/Cu=1$ and $La/Ba=4$ or at least one composite oxide of La, Sr and Cu wherein the atomic ratios of the metals are such that $(La+Sr)/Cu=1$ and $La/Sr=4$ or $La/Sr=3$. Preferably, the conductive perovskite-like oxide is represented by the formula, $La_{1-x}(Ba$ or $Sr)_xCuO_{3-a}$, wherein x is a value of 0.2 or 0.25 and a is a value of from 0.3 to 0.6. If the value of a is over 0.6, the oxide becomes unstable. It is assumed that in order to make a perovskite-like oxide whose electric conductivity is maximized, the valence of Cu is 2.5. To cause the valence of Cu to be near 2.5, Ba or Sr is added to the oxide. Specific and more preferred examples of the composite oxides include $La_4BaCu_5O_{13.4}$, $La_4SrCu_5O_{13.4}$, $La_{0.75}Sr_{0.25}CuO_{2.44}$, $La_{0.80}Sr_{0.20}CuO_{2.47}$ and the like.

These composite oxides may be prepared using organic and inorganic salts, e.g. carbonates, oxalates and the like, or oxides of La, Ba, Sr and/or Cu in predetermined molar ratios. The mixture of these oxides is sintered at 800° to 1000° C. for several hours and divided into fine powder. This procedure is repeated several times, thereby obtaining an intended composite oxide.

For instance, $La_4BaCu_5O_{13.4}$ is obtained by mixing $La_2O_3$, $BaCO_3$, and CuO at molar ratios of $La_2O_3$, $BaCO_3$ and CuO of 2:1:5, sintering the mixture of 800° to 1000° C. for several hours, and powdering the resultant product. The sintering and powdering procedure may be repeated two or three times. Likewise, $La_{0.75}Sr_{0.25}CuO_{2.44}$ and $La_{0.80}Sr_{0.20}CuO_{2.47}$ are, respectively, obtained by mixing $La_2O_3$, $SrCO_3$ and CuO at molar ratios of $La_2O_3$, $SrCO_3$ and CuO of 3/2:1:4 and 2:1:5, followed by repeating the above sintering and powdering procedure. The formation of these oxides has been confirmed by powder X-ray diffraction analysis, from which the $La_4BaCu_5O_{13.4}$ product coincides with that reported by C. Michel et al (Mat. Res. Bull., Vol. 20, pp. 667-671, 1985) and the $La_{0.75}Sr_{0.25}CuO_{2.44}$ and $La_{0.80}Sr_{0.20}CuO_{2.47}$ products are coincident with those products reported by N. Murayama (Jpn. J. Appl. Phys., Vol. 27, No. 1 pp. L55-L56, 1988).

These conductive oxides have a low specific resistance. This is advantageous for the following reason. In the dielectric element of the invention having such arrangements as shown in FIGS. 1 and 2, when a total capacitance of the dielectric layers 12 of the element is taken as c and a total resistance of the internal electrode layers 14 is taken as R, the value of tan $\delta$ at a high frequency, f, of the element used as a capacitor and a cut-off frequency, fc, of the element as an actuator are, respectively, expressed below.

tan $\delta = 2\pi f \cdot c \cdot R$ fc $= \frac{1}{2}(\pi \cdot R \cdot c)$

As will be seen from the above, a lower resistance R of the internal electrode layer results in an element with better high frequency characteristics. Thus, the conductive composite oxides of the invention having a lower specific resistance are more advantageous than $La_2NiO_4$ or semiconductive $BaTiO_3$ conventionally used for this purpose.

The electrodes attached to the unit 16 may be made of any known materials including metals such as copper, silver, nickel and the like by plating or by application of a metal paste and baking the applied paste.

The element of the invention should have a plurality of the dielectric layers and a plurality of the internal electrode layers wherein the number of the dielectric layers may vary depending upon the intended capacitance or force. Usually, 10 to 100 dielectric layers are superposed as containing internal electrode layers as described before.

When ceramic layers having different compositions are superposed and sintered as in the present invention, it is generally favorable in view of bonding strength that the resultant product is entirely converted into solid solution. When internal electrode layers made of composite oxides of La, Ba and Cu as defined before and dielectric layers of $BaTiO_3$ with addition of a sintering aid are superposed and sintered, there is a little possibility that both layers are not necessarily wholly converted into solid solution with compositional regions where two phases separate from each other. This may cause an unsatisfactory bonding characteristic. In the case where $BaTiO_3$ is used as the dielectric layer. the conductive composite oxide should preferably contain $BaTiO_3$, $SrTiO_3$ capable of forming solid solution with $BaTiO_3$ or mixtures thereof. The use of the mixture of the conductive composite oxide and $BaTiO_3$, $SrTiO_3$ or a mixture thereof as the internal electrode layer establishes strong bonding with the $BaTiO_3$ dielectric layer when the content of the additive is from 1 to 10 wt% of the total mixture. Larger amounts are unfavorable in that the specific resistance increases with a lowering of sinterability. Less amounts do not significantly contribute to the improvement of the bonding strength.

Fabrication of the multi-layered dielectric element of the invention is described.

A perovskite oxide powder with or without use of a sintering aid is dispersed in a solution of a binder resin such as cellulose derivatives, acrylic resin, polyvinyl butyral or the like to obtain a slurry, followed by forming a 5 to 100 micrometer thick green sheet by a usual manner. The solvent for the binder resin may be any known compounds alcohols such as methanol, esters such as n-butyl acetate, carbonates such as propylene carbonate and the like. Plasticizers may further be added including n-butyl phthalate, terpeneol and the like.

On the other hand, a conductive composite oxide having a perovskite-like powder is mixed with a solution of a binder resin as used above in a solvent therefor. The resultant slurry is printed on one or opposite sides of the green sheet in a dry thickness of 5 to 50 micrometers, followed by drying at 80° C. or higher.

A desired number of the dried sheets are superposed and sintered under a pressure of 1 to 50 kg/cm² at a temperature of from 900° to 1100° C. for 0.5 to 10 hours although these pressure, temperature and time conditions are not critical. The sintering is usually effected in air. As a result, a dielectric unit is obtained, to which silver, nickel or copper is plated from external electrodes which are, respectively, connected to alternate internal electrodes of one group and alternate internal electrodes of the other group described before.

When the element shown in FIG. 2 is fabricated, an insulating paste is applied to the exposed external portions 15 of the internal electrodes, as shown, before the formation of the electrodes.

The present invention is more particularly described by way of examples.

EXAMPLE 1

This example illustrates a specific resistance and sinterability of conductive composite oxides.

Powder of $La_4BaCu_5O_{13.4}$ was obtained by mixing $La_2O_3$, $BaCO_3$ and CuO at molar ratios of $La_2O_3$, $BaCO_3$ and CuO of 2:1:5, sintering the mixture at 900° C. for 2 hours, and powdering the resultant product. The sintering and powdering procedure was repeated two times. Likewise, $La_{0.75}Sr_{0.25}CuO_{2.44}$ and $La_{0.80}Sr_{0.20}CuO_{2.47}$ were, respectively, obtained by mixing $La_2O_3$, $SrO_3$ and CuO at molar ratios of $La_2O_3$, $SrCO_3$ and CuO of 1:5:1:4 and 2:1:5, followed by repeating the above sintering and powdering procedure. The formation of the above composite oxides was confirmed by powder X-ray diffraction.

Each powder obtained above was pelletized at a compression pressure of 2 tons/cm² to obtain pellets with a size of 13 mmφ, followed by sintering at 1000° C. for 2 to 10 hours. The resultant sintered samples were subjected to a DC four terminal method. As a result, it was found all the samples had a specific resistance of not higher than $10^{-}$Ω·cm. The sample obtained from the $La_4BaCu_5O_{13.4}$ product had a specific resistance of $4\times10^{-3}$ Ω·cm. When a shrinking rate is determined as $\gamma_A-\gamma_B/\gamma_A\times100$ wherein $\gamma_A$ is a diameter of the pellet before the sintering and $\gamma_B$ is a diameter after the sintering, the rate was about 17%. Thus, the sinterability was good.

In the following examples, powders of (1) $La_4BaCu_5O_{13.4}$, (2) $La_{0.75}Sr_{0.25}CuO_{2.44}$ and (3) $La_{0.80}Sr_{0.20}CuO_{2.47}$ were, respectively, used as a conductive composite oxide. 45 g of of the respective powders (1) to (3) was mixed with a solution of 2.3 g of polyvinyl butyral and 1.5 g of n-butyl phthalate in 14.5 g of methanol to obtain slurries (1) to (3). These slurries were used in examples.

EXAMPLE 2

$BaTiO_3$ to which 1 wt% of LiF was added was used to form a 40 micrometer thick green sheet for dielectric layer by a known manner. The conductive oxide slurry (1) was screen printed on opposite sides of the green sheet each in a thickness of 20 micrometers and dried at 60° C. Thereafter, the dried sheet was cut into pieces having a size of 8 mm square and 20 to 30 samples were placed on a platinum boat, followed by sintering at different temperatures for 2 hours in air.

The sintered samples were each attached with a 0.3 mmφ lead wire by the use of a silver paste at one end of the respective electrodes. The area of the silver paste was 2 mmφ. These samples were subjected to measurement of a capacitor characteristic.

In this example, a fundamental element of a multi-layered ceramic capacitor which was comprised of internal electrode layer/dielectric layer/internal electrode layer was evaluated. When a plurality of th fundamental elements are superposed, a multi-layered ceramic capacitor can be obtained. In view of the fact that the capacitance C proportionally increases and the resistance R decreases with an increasing number of the fundamental elements, the value of tan $\delta=2\pi f\cdot c\cdot R$ can be satisfactorily evaluated by assessment of the fundamental element.

When the sintering temperature was 800° C., 900° C., 1000° C., 1100° C. and 1200° C., the values of tan δ at 10 KHz were, respectively, 21%, 8%, 5%, 7% and 13%. Thus, the internal loss, tan δ, was not higher than 10% at a sintering temperature of from 900° to 1100° C. Lower temperatures were unfavorable because of the insufficient sintering. Over 1200° C., the internal loss increased by the interdiffusion. Thus, the sintering temperature was determined to range from 900° to 1100° C.

EXAMPLE 3

The general procedure of Example 2 was repeated except that the conductive oxide slurry (1) was replaced by the conductive oxide slurry (2) and the sintering temperature was 1050° C. As a result, tan $\delta = 7\%$ at 10 KHz.

EXAMPLE 4

The general procedure of Example 2 was repeated except that the conductive oxide slurry (1) was replaced by the conductive oxide slurry (3) and the sintering temperature was 1050° C. As a result, tan $\delta = 6\%$ at 10 KHz.

EXAMPLE 5

The general procedure of Example 2 was repeated except that there was used, instead of LiF, 2 wt% of BaLiF$_3$ and the sintering temperature was 1000° C. As a result, tan $\delta = 4\%$ at 10 KHz.

EXAMPLE 6

The general procedure of Example 2 was repeated except that there was used Pb(Fe$_{\frac{1}{2}}$Nb$_{\frac{1}{2}}$)$_{0.7}$(Fe$_{\frac{2}{3}}$W$_{\frac{1}{3}}$)$_{0.3}$ instead of the BaTiO$_3$ to which LiF had been added and the sintering temperature was 950° C. As a result, tan $\delta = 3\%$ at 10 KHz.

EXAMPLE 7

BaTiO$_3$ to which 3 wt% of BaLiF$_3$ was added was used to form a 50 micrometer thick green sheet for dielectric layer by a known manner. The conductive oxide slurry (1) was screen printed on the green sheet in a thickness of 50 micrometers. Thereafter, the sheet was cut into pieces having a size of 4 mm square and eight pieces were hot pressed at 60° C. to 80° C., followed by sintering at 1000° C. for 2 hours. The resultant unit was plated with external Ni electrodes to obtain an actuator of the type shown in FIG. 2.) This sample was applied with an electric field to evaluate an actuator characteristic. As a result, an amount of displacement was 3 micrometers at 100 V. This value was about 1.5 times higher than the case where La-added BaTiO$_3$ semiconductor was used as an internal electrode. This is considered to result from the high conductivity and low temperature sinterability of the conductive composite oxide of the invention, by which the internal electrode layer can be rendered thin with a reduction of the clamping effect.

As will be apparent from Examples 2 to 7, the conductive composite oxides composed of La, Ba and Cu with the atomic ratios of (La+Ba)/Cu=1 and La/Ba=4 or La, Sr and Cu with the atomic ratios of (La+Sr)/Cu=1 and La/Sr=3 or 4 are sinterable at a temperature of from 900° to 1100° C. Accordingly, the interdiffusion of metal ions at the interface with the dielectric layer is minimized, so that the dielectric layer is rarely influenced by the ions and is kept high in resistance. In addition, the conductive composite oxides exhibit metallic conductivity and have a specific resistance of not higher than 10$^{-3}$ $\Omega$·cm at room temperature. This value is higher by one order of magnitude than that of La$_2$NiO$_4$ and by at least four orders of magnitude than that of La-added BaTiO$_3$. Thus, it is possible to fabricate inexpensive multi-layered capacitors or actuators with good characteristics.

In the following examples, dielectric layers made of BaTiO$_3$ and internal electrode layers made of mixtures of the conductive composite oxide and BaTiO$_3$, SrTiO$_3$ or mixtures thereof are described.

EXAMPLE 8

Mixtures of oxalates of La, Ba and Cu used in such amounts that atomic ratios of (La+Ba)/Cu=1 and La/Ba=4 were subjected to known co-precipitation and fired at 800° C. to 900° C. to obtain a composite oxide powder. This powder was mixed with BaTiO$_3$ in different amounts and the influence of the amounts of the sinterability, conductivity and bonding with the BaTiO$_3$ layer was determined.

The sinterability and conductivity were evaluated using sintered pellets which were obtained by press molding the respective mixtures at a pressure of 1 ton/cm$^2$ to form 13 mm$\phi$ pellets, followed by sintering at predetermined temperatures.

The sinterability was evaluated as a shrinking rate expressed as $(\gamma_A - \gamma_B)/\gamma_A \times 100$ wherein $\gamma_A$ is a diameter of the pellet before the sintering and $\gamma_B$ is a diameter of the pellet after the sintering.

The specific resistance was measured by the direct current four terminal method. The results are summarized in Table 1 below.

TABLE 1

| Mixing Amount (wt. %) | Sintering Temperature (°C.) | Shrinking Rate (%) | Specific Resistance ($\Omega$-cm) |
|---|---|---|---|
| 0 | 900 | 11.2 | 11.0 × 10$^{-4}$ |
| 0 | 950 | 17.3 | 4.8 × 10$^{-4}$ |
| 0 | 1000 | 22.9 | 3.5 × 10$^{-4}$ |
| 0.5 | 1000 | 21.0 | 4.1 × 10$^{-4}$ |
| 1 | 900 | 10.1 | 16.5 × 10$^{-4}$ |
| 1 | 950 | 16.2 | 5.9 × 10$^{-4}$ |
| 1 | 1000 | 19.7 | 4.9 × 10$^{-4}$ |
| 3 | 950 | 15.1 | 8.2 × 10$^{-4}$ |
| 3 | 1000 | 17.9 | 6.6 × 10$^{-4}$ |
| 10 | 950 | 10.9 | 92.6 × 10$^{-4}$ |
| 10 | 1000 | 14.0 | 42.4 × 10$^{-4}$ |
| 20 | 950 | 7.9 | 340 × 10$^{-4}$ |
| 20 | 1000 | 10.6 | 165 × 10$^{-4}$ |

As will become apparent from the results of the table, the sinterability lowers and the specific resistance increased with an increasing mixing amount. From this, the mixing amount not less than 10 wt% is not favorable.

The bonding state was evaluated through microscopic observation in the following manner.

BaTiO$_3$ to which 0.3 wt% of LiF sintering aid was added was placed in a press mold and lightly molded at a pressure of 200 kg/cm$^2$. Subsequently, the mixtures for the internal electrode layer were each placed on the molding, followed by further press molding at a pressure of 1 ton/cm$^2$ to obtain 5 mm$\phi$ pellet and sintering at predetermined temperatures. The resulting sintered pellets were microscopically observed. The results are shown in Table 2 wherein O indicates uniform bonding over the entire interface, $\Delta$ indicates a state involving a slight degree of separation and X indicates a state involving a substantial degree of separation.

TABLE 2

| Mixing Amount (wt. %) | Sintering Temperature (°C.) | Bonding State |
| --- | --- | --- |
| 0 | 900 | O~Δ |
| 0 | 950 | Δ~X |
| 0 | 1000 | X |
| 0.5 | 1000 | Δ~X |
| 1 | 900 | O |
| 1 | 950 | O |
| 1 | 1000 | O~Δ |
| 3 | 950 | O |
| 3 | 1000 | O |
| 10 | 950 | O |
| 10 | 1000 | O |
| 20 | 950 | O |
| 20 | 1000 | O |

As will be apparent from the above results, when the mixing amount is not less than 1 wt%, the bonding is significantly improved.

EXAMPLE 9

The general procedure of Example 8 was repeated except that 3 wt% of $SrTiO_3$ was used instead of $BaTiO_3$ and the sintering was effected at 1000° C. As a result, it was found that the shrinking rate was 16.5% and the specific reistance was $7.2 \times 10^{-4}$ Ω-cm. Further, when the mixture and $BaTiO_3$ were pressured and sintered in the same manner as in Example 8 and the rsultant pellet was microscopically observed, the uniform and strong bonding over entire interface was found.

EXAMPLE 10

A mixture of oxalates of La, Sr and Cu having atomic ratios of (La+Sr)/Cu=1 and La/Sr=3 was provided and subjected to known co-precipitation and fire at 800° C. to 900° C. to obtain a composite oxide powder. This powder was mixed with $SrTiO_3$ and subjected to measurement in the same manner as in Example 8. The results on the sinterability nd conductivity are shown in Table 3 below.

TABLE 3

| Mixing Amount (wt. %) | Sintering Temperature (°C.) | Shrinking Rate (%) | Specific Resistance (Ω-cm) |
| --- | --- | --- | --- |
| 0 | 950 | 18.4 | $5.2 \times 10^{-4}$ |
| 0 | 1000 | 21.0 | $4.1 \times 10^{-4}$ |
| 0.5 | 1000 | 19.2 | $4.9 \times 10^{-4}$ |
| 1 | 950 | 15.9 | $6.1 \times 10^{-4}$ |
| 1 | 1000 | 18.0 | $5.4 \times 10^{-4}$ |
| 1 | 1100 | 17.8 | $5.7 \times 10^{-4}$ |
| 5 | 1000 | 14.5 | $12.2 \times 10^{-4}$ |
| 10 | 1000 | 12.7 | $45.9 \times 10^{-4}$ |
| 10 | 1100 | 13.5 | $44.2 \times 10^{-4}$ |
| 20 | 1100 | 11.7 | $126 \times 10^{-4}$ |

The results on bonding are shown in Table 4 below.

TABLE 4

| Mixing Amount (wt. %) | Sintering Temperature (°C.) | Bonding State |
| --- | --- | --- |
| 0.5 | 1000 | Δ |
| 1 | 1000 | O |
| 1 | 1100 | O~Δ |
| 5 | 1000 | O |
| 10 | 1000 | O |

In this case, the preferable mixing amount is also in the range of from 1 to 10 wt%.

EXAMPLE 11

The general procedure of Example 10 was repeated except that oxalates of La, Sr and Cu were mixed at atomic ratios of (La+Sr)/Cu=1 and La/Sr=1. Similar results as in Example 10 were obtained except that the specific resistance slightly increased.

EXAMPLE 12

The general procedure of Example 9 was repeated except that 1.5 wt% of $SrTiO_3$ and 1.5 wt% of $BaTiO_3$ were used instead of 3 wt% of $SrTiO_3$. Similar results are obtained.

EXAMPLE 13

The general procedure of Example 12 was repeated except that a mixture of equal amounts of a sintered powder obtained from a mixture of oxalates of La, Ba and Cu with atomic ratios of (La+Ba)/Cu=1 and La/Ba=4 and a sintered powder obtained from a mixture of oxalates of La, Sr and Cu with atomic ratios of (La+Sr)/Cu=1 and La/Sr=4 was further mixed with 3 wt% of $BaTiO_3$. As a result, the shrinking rate was 18.5% and the specific resistance was $6.9 \times 10^{-4}$ Ω-cm. When the above powder and $BaTiO_3$ were pelletized as in the foregoing examples, and sintered, the bonding between the layers was fond to be uniform and strong entirely.

As will be apparent from Examples 8 to 13, when the dielectric layer is made mainly of $BaTiO_3$ and the internal electrode layer is formed of a conductive composite oxide and $BaTiO_3$, $SrTiO_3$ or mixtures thereof, the bonding between the layers is significantly improved while keeping good sinterability and high conductivity. Thus, the yield is maintained high since little separation between the layers takes place.

What is claimed is:

1. A multi-layered dielectric element which comprises a multi-layered unit including a plurality of dielectric layers formed of a perovskite oxide capable of sintering at a temperature of from 900° to 1100° C. and a plurality of internal electrode layers which are, respectively, sandwiched between adjacent dielectric layers so that the respective internal electrode layers have exposed portions which allow contact with exteral electrodes, said internal electrodes layers being each made of at least one conductive composite oxide of La, Ba and Cu having a perovskite-like structure wherein the atomic ratios of the metals are such that (La+Ba)/Cu=1 and La/Ba=4, or at least one conductive composite oxide of La, Sr and Cu having a perovskite-like structure wherein the atomic ratios of the metals are such that (La+Sr)/Cu=1 and La/Sr=3 or 4, said unit being sintered at a temperature of from 900° to 1100° C.

2. A multi-layered dielectric element according to claim 1, wherein said perovskite oxide is made of $BaTiO_3$ to which a sintering aid capable of lowering the sintering temperature is added.

3. A multi-layered dielectric element according to claim 2, wherein wherein said sintering aid is LiF or $BaLiF_3$.

4. A multi-layered dielectric element according to claim 1, wherein said dielectric layer is made of $Pb(Fe_{\frac{1}{2}}Nb_{\frac{1}{2}})_{0.7}(Fe_{\frac{2}{3}}W_{\frac{1}{3}})_{0.3}$.

5. A multi-layered dielectric element according to claim 1, wherein said internal electrode layer is made of a conductive perovskite-like oxide of the formula, $La_{1-x}(Ba \text{ or } Sr)_xCuO_{3-a}$, wherein x is a value of 0.2 or 0.25 and a is a value of from 0.3 to 0.6.

6. A multi-layered dielectric element according to claim 1, wherein said internal electrode layer is made of $La_4BaCu_5O_{13.4}$.

7. A multi-layered dielectric element according to claim 1, wherein said internal electrode layer is made of $La_4SrCU_5O_{13.4}$.

8. A multi-layered dielectric element according to claim 1, wherein said internal electrode layr is made of $La_{0.75}Sr_{0.25}CuO_{2.44}$.

9. A multi-layered dielectric element according to claim 1, wherein said internal electrode layer is made of $La_{0.80}Sr_{0.20}CuO_{2.47}$.

10. A multi-layered dielectric element according to claim 1, wherein further comprising a pair of electrodes attached to said multi-layered unit in spaced relation, one electrode being connected to every other internal electrode layer at the exposed portion thereof, the other electrode being connected to the remaining every other electrode layer at the exposed portion.

11. A multi-layered dielectric element according to claim 10, wherein said pair of electrodes are attached to opposite sides along the thickness of said unit wherein said internal electrode layers have portions alterantely exposed at each side of said unit.

12. A multi-layered dielectric element according to claim 1, wherein said dielectric unit includes the internal electrode layers formed entirely on one or opposite sides of the respective dielectric layers.

13. A multi-layered dielectric element according to claim 12, further comprising a pair of electrodes formed in spaced relation along the thickness of said unit, one electrode being connected at one side of said unit to alternate internal electrode layers at the exposed portion thereof wherein an insulating material is placed between said one electrode and the alternate remaining internal electrodes, the other electrode being connected at the other side of said unit to the remaining internal electrode layers at the exposed portion wherein an insulating material is placed between said other electrode and the first-mentioned alternate internal electrode layers connected to said one electrode.

14. A multi-layered dielectric element according to claim 1, wherein said dielectric layers are made of $BaTiO_3$ and said internal electrode layers are made of a mixture of said conductive composite oxide and at least one oxide selected from the group consisting of $BaTiO_3$ and $SrTiO_3$ whereby good bonding between said dielectric layers and said internal electrode layers is established.

15. A multi-layered dielectric element according to claim 14, wherein said at least one oxide is $BaTiO_3$ used in an amount of from 1 to 10 wt% of the mixture.

16. A multi-layered dielectric element according to claim 14, wherein said at least one oxide is $SrTiO_3$ used in an amount of from 1 to 10 wt% of the mixture.

17. A multi-layered dielectric element according to claim 14, wherein said at least one oxide is a mixture of $BaTiO_3$ and $SrTiO_3$ used in a total amount of from 1 to 10 wt% of the mixture.

18. A multi-layered dielectric element according to claim 1, wherein said element is a capacitor.

19. A multi-layered dielelectric element according to claim 1, wherein said element is an actuator.

* * * * *